United States Patent [19]

Kumar et al.

[11] Patent Number: 5,514,451
[45] Date of Patent: May 7, 1996

[54] CONDUCTIVE VIA FILL INKS FOR CERAMIC MULTILAYER CIRCUIT BOARDS ON SUPPORT SUBSTRATES

[75] Inventors: Ananda H. Kumar, Plainsboro; Barry J. Thaler; Ashok N. Prabhu, both of Mercer; Ellen S. Tormey, Princeton Junction, all of N.J.

[73] Assignee: David Sarnoff Research Center, Inc., Princeton, N.J.

[21] Appl. No.: 379,265

[22] Filed: Jan. 27, 1995

[51] Int. Cl.$^6$ .......................................... B32B 9/00
[52] U.S. Cl. ...................... 428/210; 428/209; 428/901; 65/33.1; 65/33.5; 65/33.7; 65/33.9; 156/89; 501/6
[58] Field of Search ...................... 428/210, 209, 428/901; 156/89; 65/33.1, 33.5, 33.7

[56] References Cited

U.S. PATENT DOCUMENTS

| | | | |
|---|---|---|---|
| 3,944,696 | 3/1976 | Larry | 428/208 |
| 4,301,324 | 11/1981 | Kumar et al. | 174/68.5 |
| 4,424,251 | 1/1984 | Sugishita et al. | 428/210 |
| 4,795,670 | 1/1989 | Nishigaki et al. | 428/209 |
| 4,799,983 | 1/1989 | Desai | 156/89 |
| 5,145,540 | 9/1992 | Foley et al. | 156/89 |
| 5,232,765 | 8/1993 | Yano et al. | 428/195 |
| 5,277,724 | 1/1994 | Prabhu | 156/89 |

*Primary Examiner*—Patrick J. Ryan
*Assistant Examiner*—Kam F. Lee
*Attorney, Agent, or Firm*—William J. Burke

[57] ABSTRACT

Conductive via fill inks for green tapes to be stacked and bonded to a support substrate, the glass used for the green tape having a firing temperature from 850°–950° C., wherein the glass used for the via fill ink has a glass transition temperature that is higher than that of the glass used to make the green tape, preferably does not crystallize at the maximum firing temperature of the green tape and comprises from 30–75 percent by volume of the glass-conductive metal powder mixture of the via fill ink. These conductive via fill inks will not shrink until the green tape shrinkage has commenced during firing of the composite circuit board and they will flow slightly during firing, forming good bonds to the glass in the walls of the vias, thereby ensuring good integrity of the vias and good connections to the circuitry on the fired ceramic multilayer circuit board.

16 Claims, No Drawings

CONDUCTIVE VIA FILL INKS FOR CERAMIC MULTILAYER CIRCUIT BOARDS ON SUPPORT SUBSTRATES

This invention was made with Government support under DAAB07-94-C-C009 awarded by the US Department of the Army. The Government has certain rights in this invention.

This invention relates to conductive via fill inks for co-fired ceramic multilayer circuit boards having a support substrate. More particularly, this invention relates to improved via fill inks for supported multilayer ceramic circuit boards that reduce failures in the vias during firing.

BACKGROUND OF THE INVENTION

Multilayer ceramic circuit boards have been used for many years for circuits for electrical apparatus, such as mainframe computers. Such ceramic circuit boards are made by casting glass and/or ceramic powders together with an organic binder and forming into tapes, called green tapes, upon which a metal circuit can be patterned. Vias are formed in each green tape that are filled with a conductive material so as to connect the circuits of the various layers electrically. The green tape layers are then aligned and stacked, pressed together, and fired to burn off organic residues and sinter the glass, forming a fired multilayer ceramic circuit board.

Originally ceramics such as alumina were used to form the green tape layers, but these ceramics require high firing temperatures, up to 1500° C. This necessitated the use of refractory conductive metals, such as tungsten or molybdenum, to form the conductive circuit patterns. These refractive conductive metals can withstand high firing temperatures without melting. More recently, lower melting temperature materials have been used instead of alumina, such as devitrifying glasses that can be fired at temperatures of 1000° C. or less. Multilayer ceramic circuit boards made of these glass materials can be used with lower melting point and higher conductivity metals, such as silver, gold or copper. However, these ceramic circuit boards have the disadvantage that they are not as strong as alumina based circuit boards.

Thus more recently, the multilayer ceramic circuit boards have been bonded onto metal or ceramic support substrates that are thermally conductive. The support substrate, which can be of a metal such as nickel/cobalt/manganese alloy or Invar®, a Feronickel alloy or a composite of Cu/Kovar/Cu, Cu/Mo/Cu or Cu/Invar®/Cu and the like, or of a ceramic such as aluminum nitride, silicon carbide, and the like, imparts added strength to the composite board. However, there is a large mismatch of the coefficient of thermal expansion between conventional multilayer ceramic substrates and these support substrates. Support substrates made of metal for example do not shrink at all during the firing step, whereas the green tape layers used to form the ceramic substrate shrink about 20% in each dimension. Thus a bonding glass, such as described in U.S. Pat. No. 5,277,724 to Prabhu, has been used to adhere the green tape laminate to the support substrate. In addition, if chosen correctly, the bonding glass can totally suppress shrinkage of the green tape laminate on firing with respect to the support substrate in at least the two lateral, x and y, dimensions. Thus all of the shrinkage occurs in the thickness, or z, dimension only. This in turn reduces problems of alignment of the circuit patterns in the ceramic layers and contacts and via holes in the support substrate after firing. Thus multilayer ceramic substrates bonded to support substrates have become the medium of choice.

Conventional conductive via inks for the via connections between the multiple green tape layers are made by admixing an organic vehicle, a conductive metal powder, as of silver, gold, copper, alloys and mixtures thereof and the like, with a glass powder, generally of the same glass as is used to make the green tape. In such case the shrinkage characteristics of the green tape and of the glass in the vias are similar, and the glass in the via hole and the glass of the green tape readily sinter together at similar firing temperatures. Since the glasses and the shrinkage of both the green tapes and the conductive via fill inks are similar, the glass of the conductive via fill ink and that of the green tape layers sinter during the firing step, forming a gap-free interface.

However, in the case where a support substrate and a bonding glass layer are employed as part of the package, the shrinkage of the green tape layers in the x and y lateral directions is suppressed, and most of the shrinkage occurs in the z or thickness direction. We have found that this shrinkage behavior has an adverse effect on the integrity of conductive vias after firing the above support composite/multilayer ceramic circuit boards. Since the via holes are quite small, and the glass forms only a minority of the total conductive metal-glass composition of the via fill ink, the amount of glass in the via hole is small. In effect, this glass must shrink about 50% in volume in the thickness direction to maintain the same shrinkage characteristics as that of the green tape. Further, since the conductive metal powders which make up the majority of the conductive via fill ink formulations generally sinter before the glass-ceramic green tape compositions, the via fill inks tend to pull away from the walls of the vias during firing. This of course leads to discontinuities in the conductor paths at via-circuit intersections, and to non-hermetic vias.

The addition of more glass to conductive via fill inks has been tried in an effort to alleviate this problem and to permit more shrinkage of the via fill ink during sintering, but this solution leads to other problems, such as via bumps, cracking of the glass-ceramic around the vias as they are cooled, via porosity and even to vias that are not electrically conductive.

Thus an improved conductive via fill ink is required to overcome the above problems and to form conductive vias of integrity and correct shrinkage characteristics in ceramic multilayer circuit boards bonded to support substrates.

SUMMARY OF THE INVENTION

We have found that there are three criteria required for the glass used to make conductive via fill inks for multilayer ceramic circuit boards bonded to a support substrate. The glass transition temperature of the glass added to the conductor via fill ink must be somewhat higher than that of the glass used to make the green tape compositions; the glass must be one that preferably does not crystallize at the maximum temperature of firing of the multilayer stack; and the glass content of the via fill ink must be maintained at between 30 and 75% by volume of the glass and conductive metal powder. Via fill inks that employ such glasses will produce vias that are completely filled, that have shrinkage characteristics similar to that of the green tape compositions, and that form non-porous via fills.

DETAILED DESCRIPTION OF THE INVENTION

The glass used to make the conductive via fill inks of the present invention are used when the multilayer green tape stack in which the vias are formed are bonded to a support substrate. Such combinations change the general shrinkage characteristics of the green tape so that it shrinks mainly in the thickness direction only during firing.

The glass transition temperature of the glass used to make the conductive via fill inks of the present invention must be at least somewhat higher than the glass transition temperature of the glass used to make the green tape, i.e., from at least about 5° C. higher, but the glass transition temperature must be lower than the maximum temperature of firing encountered during preparation of the ceramic multilayer circuit board. For example, when magnesium aluminosilicate glasses are employed to make the green tapes, the glass transition temperature is about 850° C. and the maximum temperature of firing used is about 950° C. The amount of glass employed to make the conductor via fill ink must be limited to less than 75% by volume of the conductive metal-glass composite to ensure that the via remains electrically conductive.

The glass used to make the conductive via fill inks must also be one that preferably does not crystallize at the maximum firing temperature employed. Such a glass will soften or even flow above its glass transition temperature, which in the present case means that the glass will fill all the interstices in the vias and make a good bond to the glass in the walls of the vias. If the glass used for the via does crystallize, such crystallization should be preceded by a significant amount of shrinkage by sintering The first and second criteria ensure that the glass in the via will be sintered after most of the sintering and shrinkage in the green tape will have occurred. Thus the shrinkage in the green tape, which occurs primarily in the z or thickness direction, will take place before the sintering of the glass in the via hole begins. This will reduce the tendency for the via fill ink to pull away from the walls of the via as sintering of the via ink occurs. The fact that the glass in the via does not prematurely crystallize has the effect that the glass in the via will soften as the firing temperature increases, and even flow slightly. Thus most of the shrinkage will occur in the thickness direction also, since the ink cannot expand laterally because the green tape has already been sintered. However, the slight flow of the via glass provides a good bond between the glass of the conductive via ink and the glass used to make the green tape. If a low temperature crystallizing glass were employed, such softening would not occur, but tall via bumps would appear.

To illustrate preparation of a suitable system, a green tape was made from a magnesium aluminosilicate glass which converts to forsterite-cordierite type crystal phases, or other magnesium silicate crystal phases, after firing. A suitable glass has the following composition:

| Component Oxide | % by Weight |
| --- | --- |
| MgO | 29.0 |
| $Al_2O_3$ | 22.0 |
| $SiO_2$ | 45.0 |
| $P_2O_5$ | 1.5 |
| $B_2O_3$ | 1.0 |
| $ZrO_2$ | 1.5 |

The above glass, when heated and its glass transition temperature measured by differential thermal analysis (DTA) at a heating rate of 10° C./min, had a glass transition temperature of 850° C. and a crystallization temperature between 925°–950° C., depending on the particle size of the glass.

A green tape composition was made from the above glass in conventional manner. Green tape compositions can be made by admixing glass powders with an organic vehicle including a resin binder in a suitable solvent. Suitable and well known surfactants and plasticizers are generally also added to obtain a paint-like slurry. Examples of suitable resins include polyvinyl butyral, cellulose derivatives such as ethyl cellulose, synthetic resins such as polyacrylates, polymethacrylates, polyesters, polyolefins and the like. Examples of suitable solvents include methyl ethyl ketone, methyl isobutyl ketone, toluene and the like. The vehicles generally contain from about 5 to about 25 percent by weight of the resin binder, although this can be adjusted to obtain the correct rheology of the mixture. About 1–3 percent of a surfactant such as an oleylamine or fish oil is generally employed. An example of a suitable plasticizer is benzyl phthalate. If desired a viscosity modifier can also be added, such as an oil derivative. The green tape composition generally contains from about 60–75 percent by weight of the glass powder in the organic vehicle. However, a minor amount of a filler such as alumina or other ceramic can also be added.

Thus the above glass powder is admixed with a resin such as polyvinyl butyrate and a solvent such as methyl ethyl ketone together with a minor amount of a plasticizer and a surfactant in a ball mill for several hours to obtain a slurry which is cast in a mold or doctor bladed onto a polyester tape to form a green tape layer, which is then dried. The green tape is then cut to a desired size and via holes are punched into the tape, the via holes having a diameter for example of 0,008 inch. Thick film circuit patterns are then formed on each of the green tape layers in conventional manner, such as by screen printing with thick film inks.

The via holes are then filled by screen printing a conductor via fill ink onto the tape.

Conductor via fill inks are made by admixing a conductive metal powder having a particle size of 3–5 microns, such as of copper, silver, gold and mixtures and alloys thereof, together with a glass and an organic vehicle. In the present case, the glass will be chosen to meet the three criteria discussed hereinabove. The organic vehicle suitably is an ethyl cellulose and an acrylic resin but other known organic materials can be used, such as polymethylmethacrylates, polyesters, polyolefins and the like. The viscosity of the ink is adjusted with an organic solvent similar to those enumerated above for making the green tape compositions. The ink is mixed in a three roll mill and applied to the green tape by screen printing or other well known methods.

We have found that certain glasses in the $CaO—Al_2O_3—SiO_2$ ternary system, in the composition range from about 20–30% by weight of calcium oxide, from about 15–25% by weight of aluminum oxide, from about 45–60% by weight of silicon oxide and minor amounts of additional metal oxides, are particularly suited for the present via ink application for use with conventional green tape compositions.

When these calcium oxide-aluminosilicate glasses comprise about 35–75% by volume of the solids in the via ink, vias are obtained in the multilayer structures that exhibit minimal bump heights (75 microns) vias with adequate electrical conductivity, vias with little or no porosity and having good sidewall continuity with the surrounding dielectric glass-ceramic. Further there is little or no tendency toward cracking in the adjacent dielectric material. For purposes of this invention, solids volume is defined as the combined volume of the conductive metal powder and glass powder in a given volume of the ink.

A portion of the glass powder in the above via inks, up to about 50% by volume of the glass constituent, may be replaced by low expansion, inert materials such as fused silica or crystalline cordierite. These inks are free of cracking adjacent to the dielectric material of the multilayer ceramics, but they do exhibit some porosity, up to 10% by volume. This may be due to the lowering of the thermal expansion of the composite via structure that forms on firing.

The glass chosen as an example herein is a calcium aluminosilicate glass having the following composition:

| Component Oxide | % by Weight |
| --- | --- |
| CaO | 26.0 |
| $Al_2O_3$ | 20.0 |
| $SiO_2$ | 50.0 |
| $P_2O_5$ | 1.5 |
| $ZrO_2$ | 2.5 |

This glass has a glass transition temperature (Tg) of 905° C. This glass thus has a higher Tg than the glass used to make the green tape, but the Tg is lower than the maximum firing temperature of 915° C. Furthermore the glass did not exhibit a tendency to crystallize up to a temperature of 1000° C., as is apparent from the absence of a crystallization peak in a differential thermal analysis (DTA). The above glass was mixed with silver powder in a proportion of 35–75% by volume of glass to silver. A resin binder and a solvent made up the remainder of the ink. This via ink was screen printed into the via holes of the above green tape.

Six of the printed green tape layers were stacked together, the vias aligned with each other, and the stack pressed together in a platen press using 1500 psi pressure at 90° C. to form a green laminate.

The resultant laminate was aligned on a prepared Cu/Mo/Cu composite support substrate having a bonding glass layer thereon. The composite was heated gradually to 915° C. to remove the organics and to sinter the glass in the green tape.

The fired ceramic substrate exhibited vias that were flush with the ceramic surface, exhibited no cracking or other lack of integrity of the vias, and exhibited no porosity. Thus the via was solidly filled, and problems of cracking and porosity of the via were avoided for the present green tape-conductive via fill combination.

In another example, a via ink in which 50% by volume of the glass constituent of the ink as described above was replaced with fused silica was employed to fill vias. Again, the fired substrate had vias having bumps not exceeding 75 microns, adequate electrical conductivity, good sidewall continuity and no cracking was observed. These vias exhibited about 5–10% porosity, but the pores were isolated in the via structure, and did not detract from the hermeticity of the vias.

As a control, silver powder was mixed with a lead-based glass in a ratio of 4:1 percent by weight together with ethyl cellulose and an acrylic resin in a suitable solvent to form a Control via fill conductor ink composition, which was screened onto the green tapes as described above for the example. The lead-based glass had a glass transition temperature of 525° C. as determined by DTA analysis, which was much lower than the Tg of the glass used to make the green tape. The conductor via fill ink was applied to the green tapes by screen printing, six of the green tapes were stacked and pressed together, aligned with a Cu/Mo/Cu composite metal support substrate and heated to 915° C. to remove the organics and sinter the glass used to make the green tape.

All of the vias exhibited problems such as porosity, separation of the via fill from the walls of the vias, glass bumps at the periphery of the vias and the like, which made the fired multilevel printed circuit board unusable.

In another control, a via ink containing 50% by volume of the same magnesium aluminosilicate crystallizing glass as that used to make the green tape was used to make a via fill ink. After laminating and firing six layers of such green tape, the vias were examined. They had unacceptably high via bumps 100–120 microns in height, and had an unacceptably high degree of porosity. It is believed the crystallization of the glass additive in the via ink reduces its ability to shrink or flow to the necessary extent.

Thus when conductor via fill inks are made in accordance with the above criteria, i.e., the glass employed has a glass transition temperature higher than that of the glass used to make the green tapes, but not exceeding the peak firing temperature employed, which glass preferably does not crystallize at the maximum temperature of firing of the green tape, and when a proper proportion of glass and conductive metal are used, shrinkage in the vias occurs after shrinkage in the green tape composition, ensuring that the shrinkage in the via is also in the thickness direction, that the via is solidly filled, and that problems of porosity of the glass and cracking of the glass at the edges of the via are avoided.

Although the present invention has been described by means of specific embodiments, one skilled in the art can readily substitute other materials including conductive metals, the various glasses, and reaction conditions in place of those employed herein without departing from the spirit of the invention. Thus the invention is only meant to be limited by the scope of the appended claims.

We claim:

1. A ceramic multilayer circuit board precursor comprising a plurality of stacked green tape compositions having conductive metal circuitry formed thereon and having via holes therein, the stack supported on a support substrate, said via holes filled with a conductive ink comprising a conductive metal powder and a glass having a glass transition temperature that is higher than the glass employed for the green tape composition but lower than the maximum temperature of firing of the green tape, said conductive ink composition comprising from 30–75 percent by volume of said glass and 25–70 percent by volume of conductive metal.

2. A ceramic multilayer circuit board precursor according to claim 1 wherein the glass employed to make the green tape composition is a glass having a glass transition temperature of no more 850° C. and a firing temperature of up to 950° C.

3. A ceramic multilayer circuit board precursor according to claim 2 wherein said glass includes a calcium aluminosilicate glass containing 20–30 percent by weight.

4. A ceramic multilayer circuit board precursor according to claim 3 wherein said via fill conductor ink comprises a glass having a composition comprising from 20–30 percent by weight of calcium oxide, from 15–25 percent by weight of aluminum oxide, from 45–60 percent by weight of silicon oxide, up to 2 percent by weight of boron oxide and up to 2 percent by weight of phosphorus pentoxide.

5. A ceramic multilayer circuit board precursor according to claim 4 wherein glass comprises a calcium aluminosilicate glass and up to 50 percent by volume of a second glass or crystalline additive.

6. A ceramic multilayer circuit board precursor according to claim 5 wherein said second glass is fused silica.

7. A ceramic multilayer circuit board precursor according to claim 5 wherein said second glass is crystalline cordierite.

8. A ceramic multilayer circuit board precursor according to claim 1 wherein said support substrate is selected from the group consisting of kovar, a ferronickel, and composites of copper/molybdenum/copper, copper/ferronickel/copper, and copper/kovar/copper.

9. A fired circuit board of the precursor of claim 1.
10. A fired circuit board of the precursor of claim 2.
11. A fired circuit board of the precursor of claim 4.
12. A fired circuit board of the precursor of claim 7.
13. A fired circuit board of the precursor of claim 9.
14. A via fill conductor ink comprising a glass having a composition comprising from 20–30 percent by weight of calcium oxide, from 15–25 percent by weight of aluminum oxide, from 45–60 percent by weight of silicon oxide, up to 2 percent by weight of boron oxide and up to 2 percent by weight of phosphorus pentoxide and a conductive metal powder.

15. A via fill conductor ink according to claim 14 wherein said ink contains from 30–75 percent by volume of said glass.

16. A via fill conductor ink according to claim 15 wherein said conductive metal is silver.

* * * * *